US010062778B2

United States Patent
Izumi et al.

(10) Patent No.: US 10,062,778 B2
(45) Date of Patent: *Aug. 28, 2018

(54) SEMICONDUCTOR DEVICE (71) Applicant: ROHM CO., LTD., Kyoto (JP)

(72) Inventors: Naoki Izumi, Kyoto (JP); Tomoyasu Sada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/062,696

(22) Filed: Mar. 7, 2016

(65) Prior Publication Data

US 2016/0190311 A1    Jun. 30, 2016

Related U.S. Application Data (63) Continuation of application No. 12/232,011, filed on Sep. 9, 2008, now Pat. No. 9,299,833.

(30) Foreign Application Priority Data

Sep. 10, 2007    (JP) .................................. 2007-234472

(51) Int. Cl.
*H01L 29/78* (2006.01)
*H01L 29/08* (2006.01)
(Continued)

(52) U.S. Cl.
CPC ...... *H01L 29/7824* (2013.01); *H01L 29/0878* (2013.01); *H01L 29/1083* (2013.01);
(Continued)

(58) Field of Classification Search
CPC ........................ H01L 29/7824; H01L 29/0878
(Continued)

(56) References Cited

U.S. PATENT DOCUMENTS 5,072,287 A    12/1991  Nakagawa et al.
5,097,314 A  *  3/1992  Nakagawa ............ H01L 21/761
                                                    257/500
(Continued)

FOREIGN PATENT DOCUMENTS

JP    H08-236618 A    9/1996
JP    H09-097832 A    4/1997
(Continued)

*Primary Examiner* — Ori Nadav
(74) *Attorney, Agent, or Firm* — Rabin & Berdo, P.C.

(57) ABSTRACT

A semiconductor device according to the present invention includes: an insulating layer; a semiconductor layer of a first conductive type laminated on the insulating layer; an annular deep trench having a thickness reaching the insulating layer from a top surface of the semiconductor layer; a body region of a second conductive type formed across an entire thickness of the semiconductor layer along a side surface of the deep trench in an element forming region surrounded by the deep trench; a drift region of the first conductive type constituted of a remainder region besides the body region in the element forming region; a source region of the first conductive type formed in a top layer portion of the body region; a drain region of the first conductive type formed in a top layer portion of the drift region; and a first conductive type region formed in the drift region, having a deepest portion reaching a position deeper than the drain region, and having a first conductive type impurity concentration higher than the first conductive type impurity concentration of the semiconductor layer and lower than the first conductive type impurity concentration of the drain region.

13 Claims, 9 Drawing Sheets

(51) Int. Cl.
*H01L 29/66* (2006.01)
*H01L 29/10* (2006.01)
*H01L 29/40* (2006.01)
*H01L 29/423* (2006.01)

(52) U.S. Cl.
CPC ........ *H01L 29/1095* (2013.01); *H01L 29/402* (2013.01); *H01L 29/66681* (2013.01); *H01L 29/42368* (2013.01)

(58) Field of Classification Search
USPC .................................................. 257/335–343
See application file for complete search history.

(56) References Cited

U.S. PATENT DOCUMENTS

| | | | |
|---|---|---|---|
| 5,382,818 A | 1/1995 | Pein | |
| 5,485,027 A | 1/1996 | Williams et al. | |
| 5,780,900 A | 7/1998 | Suzuki et al. | |
| 6,118,152 A | 9/2000 | Yamaguchi et al. | |
| 6,130,458 A | 10/2000 | Takagi et al. | |
| 6,242,787 B1 | 6/2001 | Nakayama et al. | |
| 6,252,279 B1 * | 6/2001 | Kim | H01L 29/7816 257/335 |
| 6,313,508 B1 | 11/2001 | Kobayashi | |
| 6,380,566 B1 | 4/2002 | Matsudai et al. | |
| 6,448,620 B2 * | 9/2002 | Hayasaki | H01L 29/0878 257/348 |
| 6,469,346 B1 | 10/2002 | Kawaguchi et al. | |
| 6,552,396 B1 | 4/2003 | Bryant et al. | |
| 6,642,599 B1 | 11/2003 | Watabe et al. | |
| 7,238,987 B2 | 7/2007 | Ikuta et al. | |
| 2001/0013624 A1 | 8/2001 | Hayasaki et al. | |
| 2001/0038125 A1 | 11/2001 | Ohyanagi et al. | |
| 2002/0005550 A1 | 1/2002 | Takahashi et al. | |
| 2002/0190309 A1 | 12/2002 | Takahashi et al. | |
| 2004/0145027 A1 | 7/2004 | Nitta et al. | |
| 2006/0001122 A1 | 1/2006 | Ichijo et al. | |
| 2007/0090451 A1 | 4/2007 | Lee | |
| 2007/0108520 A1 | 5/2007 | Lin et al. | |

FOREIGN PATENT DOCUMENTS

| | | |
|---|---|---|
| JP | H09-120995 A | 5/1997 |
| JP | H09-205210 A | 8/1997 |
| JP | H10-189983 A | 7/1998 |
| JP | H11-135794 A | 5/1999 |
| JP | 11-195712 A | 7/1999 |
| JP | 11-251597 A | 9/1999 |
| JP | 2000-232224 A | 8/2000 |
| JP | 2001-025235 A | 1/2001 |
| JP | 2001-244472 A | 9/2001 |
| JP | 2001-308338 A | 11/2001 |
| JP | 2001-352070 A | 12/2001 |
| JP | 2002-314087 A | 10/2002 |
| JP | 2004-228466 A | 8/2004 |
| JP | 2006-019508 | 1/2006 |
| JP | 2007-088334 A | 4/2007 |
| JP | 2007-103672 A | 4/2007 |
| JP | 2007-123887 A | 5/2007 |

\* cited by examiner

SEMICONDUCTOR DEVICE

CROSS-REFERENCE TO RELATED APPLICATIONS

This is a continuation of U.S. application Ser. No. 12/232,011, filed Sep. 9, 2008. Furthermore, this application claims the benefit of foreign priority of Japanese application 2007-234472, filed Sep. 10, 2007. The disclosures of these earlier applications are incorporated herein by reference.

BACKGROUND OF THE INVENTION

Field of the Invention

The present invention relates to a semiconductor device including an LDMOSFET (Lateral Double Diffused Metal Oxide Semiconductor Field Effect Transistor).

Description of Related Art

Among semiconductor devices including an LDMOSFET, there is a configuration employing a thick film SOI (Silicon On Insulator) substrate as a base to increase withstand voltage of the LDMOSFET.

Figure 6:
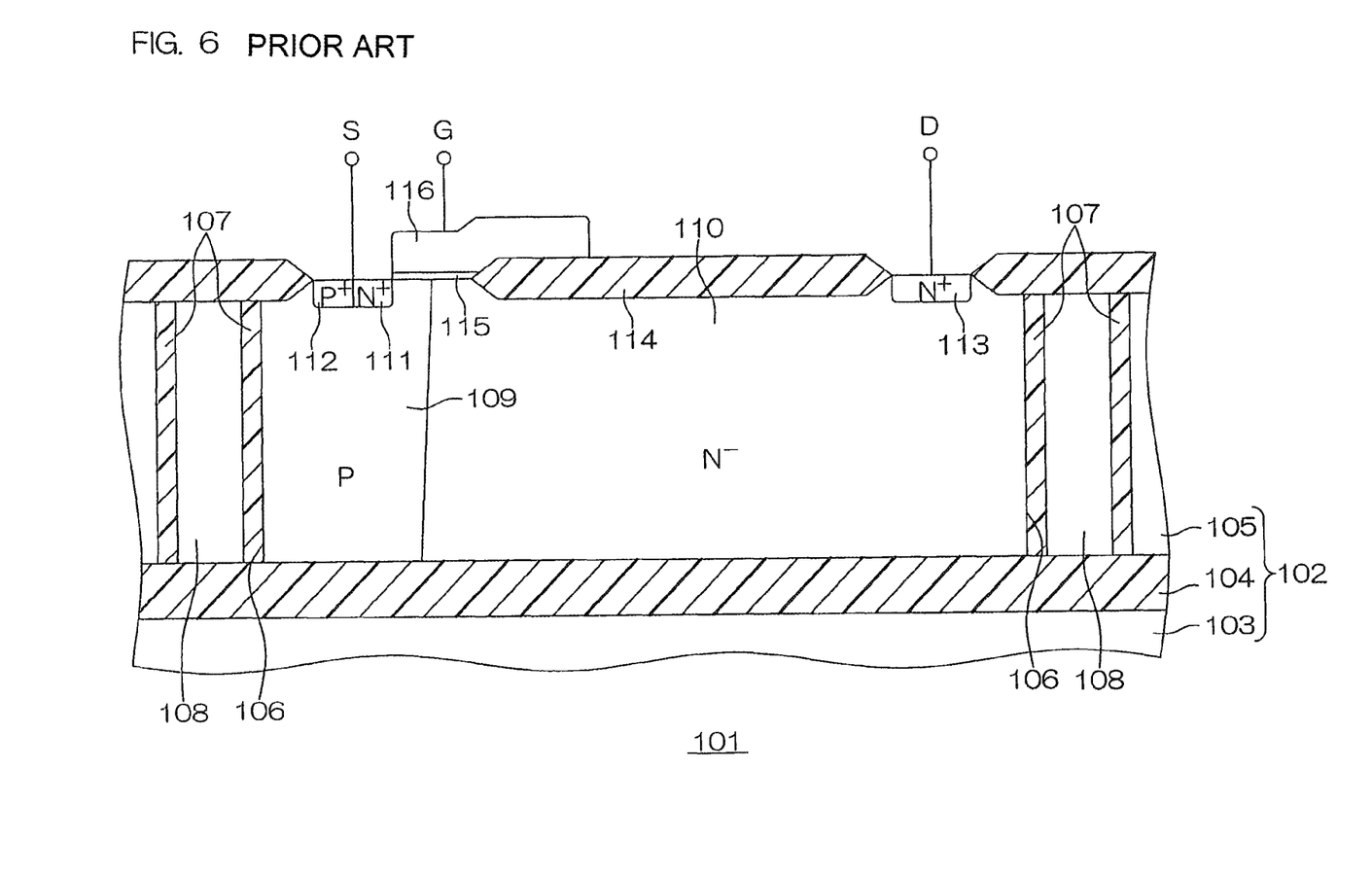
FIG. 6 is a schematic sectional view of a conventional semiconductor device including an LDMOSFET.

FIG. 6 is a schematic sectional view of a semiconductor device including an LDMOSFET of high withstand voltage.

A thick film SOI substrate 102 forming a base of the semiconductor device 101 has a structure where an SOI layer 105 made of Si (silicon) is laminated on a silicon substrate 103 via a BOX (buried oxide) layer 104 made of $SiO_2$ (silicon dioxide).

An annular deep trench 106 is formed by digging in from a top surface of the SOI layer 105. A deepest portion of the deep trench 106 reaches the BOX layer 104. An interior of the deep trench 106 is completely filled with a polysilicon 108 via a silicon oxide film 107. A region surrounded by the deep trench 106 is thereby made an element forming region that is insulatingly separated (dielectrically separated) from its surroundings.

An LDMOSFET is formed in the element forming region. Specifically, in the element forming region, a P-type body region 109 is formed along a side surface of the deep trench 106 in the SOI layer 105. A region 110 besides the body region 109 in the element forming region is an $N^-$-type (low concentration N-type) drift region. An $N^+$-type (high concentration N-type) source region 111 and a $P^+$-type (high concentration P-type) body contact region 112 are formed adjacent to each other on a top layer portion of the body region 109. An $N^+$-type drain region 113 is formed in a top layer portion of the drift region 110.

On a top surface of the drift region 110, a LOCOS oxide film 114 is formed between the body region 109 and the drain region 113. On the top surface of the SOI layer 105, a gate oxide film 115 is formed between the source region 111 and the LOCOS oxide film 114. A gate electrode 116 is formed on the gate oxide film 115.

With this structure, a high positive voltage applied to the drain region 113 (drain voltage) can be apportioned between a depletion layer formed in the drift region 110 and the BOX layer 104 to increase the withstand voltage of the LDMOSFET.

To further increase the withstand voltage of the LDMOSFET, an impurity concentration of the drift region 110 can be further decreased. However, if the impurity concentration of the drift region 110 is decreased, the depletion layer extends greatly toward the drain region 113 (a width in a depth direction of the depletion layer increases) and a depletion layer capacitance decreases. Because the drain voltage apportioned to the BOX layer 104 consequently decreases, the SOI layer 105 (drift region 110) must be made large in layer thickness to maintain the withstand voltage. For example, in a case where the layer thickness of the BOX layer 104 is 1.5 μm and the N-type impurity concentration of the drift region 110 is $3.5 \times 10^{14}/cm^3$, the SOI layer 105 must be made no less than 40 μm in thickness to obtain a withstand voltage of 600V. When the layer thickness of the SOI layer 105 is large, it is difficult to form the deep trench 106 and the semiconductor device takes trouble and time to manufacture.

The layer thickness of the BOX layer 104 may be increased to increase the drain voltage apportioned to the BOX layer 104, suppress the spread of the depletion layer in the drift region 110, and thereby avoid increasing the layer thickness of the SOI layer 105. However, a thick film SOI substrate 102 having a BOX layer 104 with a layer thickness of no less than 4 μm cannot be manufactured by current arts. Thus, even when the layer thickness of the BOX layer 104 is set to 4 μm to obtain a withstand voltage of 600V when the N-type impurity concentration of the drift region 110 is $3.5 \times 10^{14}/cm^3$, the SOI layer 105 cannot be made 40 μm or less in layer thickness.

SUMMARY OF THE INVENTION

An object of the present invention is to provide a semiconductor device that enables a layer thickness of a semiconductor layer to be small without lowering a withstand voltage of an element.

A semiconductor device according to one aspect of the present invention includes: an insulating layer; a semiconductor layer of a first conductive type laminated on the insulating layer; an annular deep trench having a thickness reaching the insulating layer from a top surface of the semiconductor layer; a body region of a second conductive type formed across an entire thickness of the semiconductor layer along a side surface of the deep trench in an element forming region surrounded by the deep trench; a drift region of the first conductive type constituted of a remainder region besides the body region in the element forming region; a source region of the first conductive type formed in a top layer portion of the body region; a drain region of the first conductive type formed in a top layer portion of the drift region; and a first conductive type region formed in the drift region, having a deepest portion reaching a position deeper than the drain region, and having a first conductive type impurity concentration higher than the first conductive type impurity concentration of the semiconductor layer and lower than the first conductive type impurity concentration of the drain region.

With this semiconductor device, the annular deep trench is formed in the semiconductor layer of the first conductive type laminated on the insulating layer. The deep trench has a depth reaching the insulating layer from the top surface of the semiconductor layer. The body region of the second conductive type and the drift region of the first conductive type constituted of the remainder region besides the body region are formed in the element forming region surrounded by the deep trench. The drift region has a first conductive type impurity concentration equal to the first conductive type impurity concentration of the semiconductor layer. The source region of the first conductive type is formed in the top layer portion of the body region. The drain region of the first conductive type is formed in the top layer portion of the drift region. The first conductive type region having a first conductive type impurity concentration higher than first conductive type impurity concentration of the semiconductor layer (drift region) and lower than the first conductive type impurity concentration of the drain region is formed in the drift region. The deepest portion of the first conductive type region reaches the position deeper than the drain region.

By forming the first conductive type region, the depletion layer can be suppressed from extending toward the drain region. Thus, the layer thickness of the semiconductor layer can be small without lowering the withstand voltage of the element formed in the element forming region. Consequently, the deep trench can be formed readily, and the trouble and time required to manufacture the semiconductor device can be reduced.

The first conductive type region may be formed spaced apart from and at the insulating layer side of the drain region or may be formed adjacent to and at the insulating layer side of the drain region.

For example, when the impurity concentration of the semiconductor layer (drift region) is $3.5 \times 10^{14}/cm^3$ and the first conductive type impurity concentration of the drain region is $10^{20}/cm^3$, a maximum value of the first conductive type impurity concentration (peak concentration) in the first conductive type region is preferably $10^{18\sim19}/cm^3$.

The first conductive type region preferably has the peak concentration at a position of 0 to 10 μm depth from the top surface of the drain region, and more preferably has the peak concentration at a position of 2 to 5 μm depth from the top surface of the drain region.

When the peak concentration is $10^{18\sim19}/cm^3$ and the peak concentration is located at a position of 2 to 5 μm depth from the top surface of the drain region, an element withstand voltage of no less than 600V can be obtained with the layer thickness of the insulating layer being 1.5 μm and the layer thickness of the semiconductor layer being 30 μm.

The foregoing and other objects, features and effects of the present invention will become more apparent from the following detailed description of the embodiments with reference to the attached drawings.

DETAILED DESCRIPTION OF PREFERRED EMBODIMENTS

Embodiments of the present invention shall now be described in detail with reference to the attached drawings.

Figure 1:
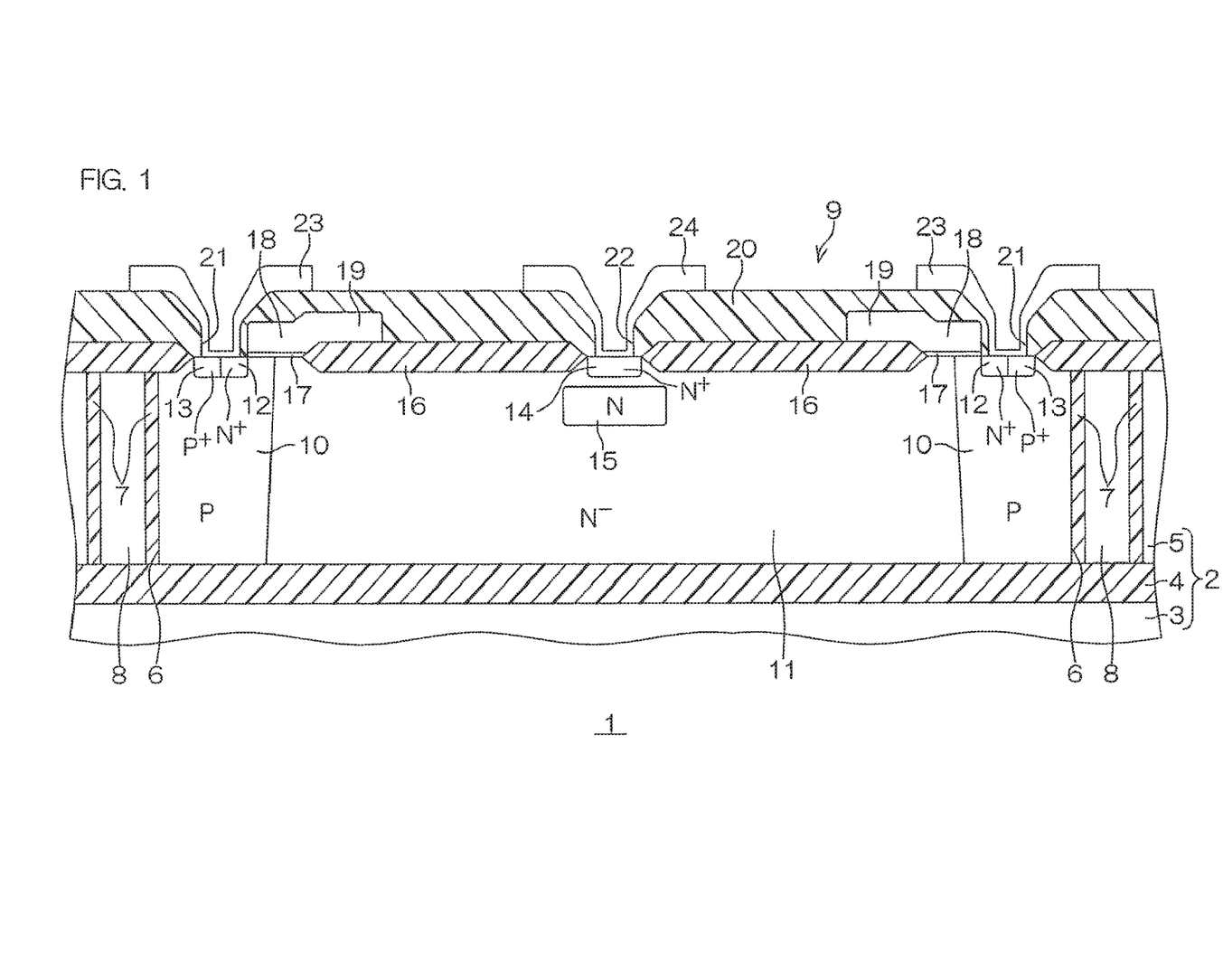
FIG. 1 is a schematic sectional view of a structure of a semiconductor device according to a first embodiment of the present invention.

FIG. 1 is a schematic sectional view of a structure of a semiconductor device according to a first embodiment of the present invention.

The semiconductor device 1 includes a thick film SOI substrate 2. The thick film SOI substrate 2 has a structure where an N⁻-type SOI layer 5 made of Si is laminated on a silicon substrate 3 via a BOX layer 4 as an insulating layer made of $SiO_2$. A layer thickness of the BOX layer 4 is, for example, 1.5 μm and the layer thickness of the SOI layer 5 is, for example, 30 μm. An N-type impurity concentration of the SOI layer 5 is, for example, $3.5 \times 10^{14}/cm^3$.

An annular deep trench 6 is penetratingly formed in the layer thickness direction in the SOI layer 5 as a semiconductor layer. That is, the annular deep trench 6 having a depth reaching from the top surface of the SOI layer 5 to the BOX layer 4 is formed in the SOI layer 5. An inner side surface of the deep trench 6 is covered with a silicon oxide film 7. An inner side of the silicon oxide film 7 is completely filled with a polysilicon 8. A region surrounded by the deep trench 6 is thereby made an element forming region 9 that is insulatingly separated (dielectrically separated) from its surroundings by the BOX layer 4 and the silicon oxide film 7.

An LDMOSFET is formed in the element forming region 9. Specifically, in the element forming region 9, a P-type body region 10 is formed in the SOI layer 5. The body region 10 has an annular form along the side surface of the deep trench 6 and is formed across an entire thickness of the SOI layer 5. A region 11 besides the body region 10 in the element forming region 9 is an N⁻-type drift region and has an N-type impurity concentration equal to the N-type impurity concentration of the SOI layer 5.

An N⁺-type source region 12 and a P⁺-type body contact region 13 are formed annularly on a top layer portion of the body region 10. The source region 12 and the body contact region 13 are mutually adjacent.

On a top layer of the drift region 11, an N⁺-type drain region 14 is formed at a central portion in a plan view. The drain region 14 has an N-type impurity concentration of, for example, $10^{20}/cm^3$.

An N-type region 15 having an N-type impurity concentration higher than the N-type impurity concentration of the SOI layer 5 and lower than the N-type impurity concentration of the drain region 14 is formed in the drift region 11. With the semiconductor device 1 shown in FIG. 1, the N-type region 15 is formed at a position deeper than the drain region 14 to be spacedly opposed to the drain region 14. With the N-type region 15, for example, a maximum value (peak concentration) of the N-type impurity concentration is $10^{19}/cm^3$, and the peak concentration is located at a depth of 5 μm from a top surface of the drain region 14.

On a top surface of the drift region 11, a LOCOS oxide film 16 is formed between the drain region 14 and a position spaced apart by a predetermined interval from a boundary of the body region 10. Between the source region 12 and the LOCOS oxide film 16, a gate oxide film 17 is formed on the top surface of the SOI layer 5. A gate electrode 18 is formed on the gate oxide film 17. A field plate 19 is formed integrally to the gate electrode 18 on the LOCOS oxide film 16.

An upper side of the thick film SOI substrate 2 is covered by an interlayer insulating film 20 made of $SiO_2$. A source contact hole 21 facing the source region 12 and the body contact region 13 and a drain contact hole 22 facing the drain region 14 are formed penetratingly through the interlayer insulating film 20.

A source wiring 23 and a drain wiring 24 are formed on the interlayer insulating film 20. The source wiring 23 is connected to the source region 12 and the body contact region 13 via the source contact hole 21. The drain wiring 24 is connected to the drain region 14 via the drain contact hole 22.

By grounding the source wiring 23 and controlling a potential at the gate electrode 18 while applying a high positive voltage (drain voltage) to the drain wiring 24, a channel can be formed near an interface of the gate oxide film 17 in the body region 10 to flow a current between the source region 12 and the drain region 14.

By the N-type region 15 being formed at the BOX layer 4 side of the drain region 14, a depletion layer can be suppressed from extending toward the drain region 14 when the drain voltage is applied. Thus, the SOI layer 5 can thus be small in layer thickness without lowering a withstand voltage of the LDMOSFET formed in the element forming region 9.

For example, in a case where the layer thickness of the BOX layer 4 is 1.5 μm, the N-type impurity concentration of the drift region 11 is $3.5 \times 10^{14}/cm^3$, the peak concentration of the N-type region 15 is $10^{19}/cm^3$, and the peak concentration is located at a depth of 5 μm from the top surface of the drain region 14, a withstand voltage of no less than 600V can be obtained with the layer thickness of the SOI layer 5 being 30 μm. That is, whereas with the conventional structure, a layer thickness of no less than 40 μm is required of the SOI layer to obtain a withstand voltage of no less than 600V, with the semiconductor device 1, the thickness layer of the SOI layer 5 may be 30 μm. By decreasing the layer thickness of the SOI layer 5, the deep trench 6 can be formed readily, and the trouble and time required to manufacture the semiconductor device 1 can thus be reduced.

FIGS. 2A to 2E are schematic sectional views for describing a method for manufacturing the semiconductor device shown in FIG. 1.

Figure 2A:
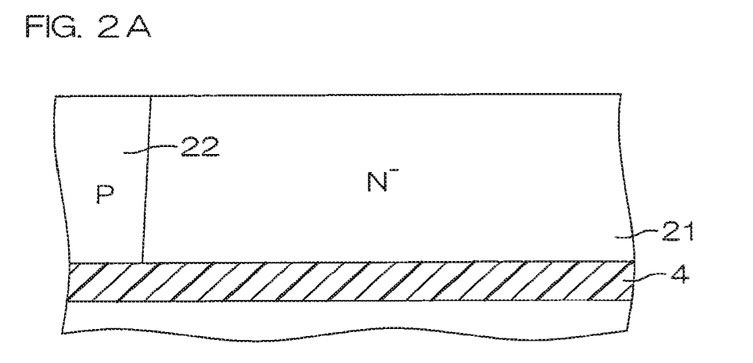
FIG. 2A is a schematic sectional view for describing a method for manufacturing the semiconductor device shown in FIG. 1.

For example, by implanting O (oxygen) in an $N^-$-type silicon substrate by an ion implantation method and thereafter thermally oxidizing the O, a thick film SOI substrate having the BOX layer 4 of 1.5 μm layer thickness and an $N^-$-type silicon layer 21 of 25 μm layer thickness is formed as shown in FIG. 2A. In this preparation process, a P-type region 22 is formed by selectively implanting B (boron) or other P-type impurity in the $N^-$-type silicon layer 21.

Figure 2B:
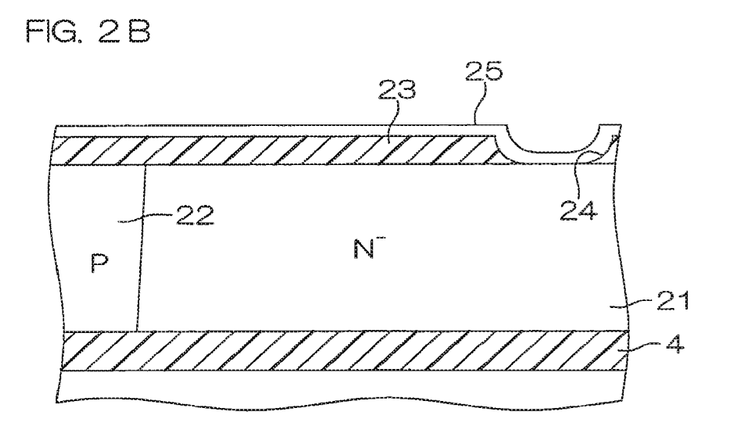
FIG. 2B is a schematic sectional view of a step subsequent to that of FIG. 2A.

Then, as shown in FIG. 2B, a thermal oxide film 23 made of $SiO_2$ is formed on the $N^-$-type silicon layer 21 by a thermal oxidation method. An opening 24 partially exposing a top surface of the $N^-$-type silicon layer 21 is formed in the thermal oxide film 23 by a known photolithography technique and etching technique. Thereafter, a coating film 25 made of a material containing As (arsenic) or P-type (phosphorus) or other N-type impurity is formed on the thermal oxide film 23. The coating film 25 is also formed inside the opening 24 and contacts the top surface of the $N^-$-type silicon layer 21 inside the opening 24.

Figure 2C:
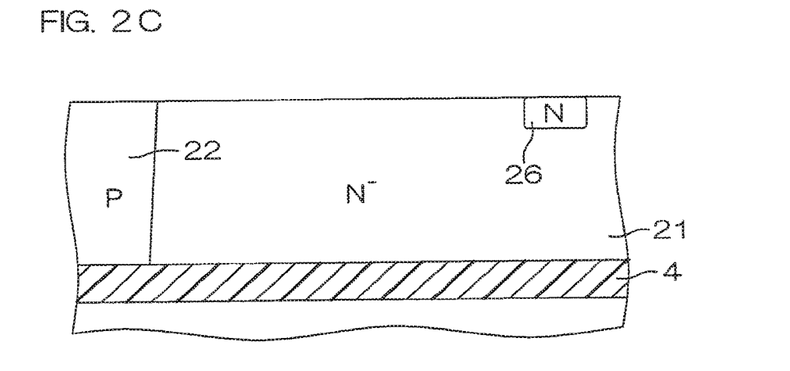
FIG. 2C is a schematic sectional view of a step subsequent to that of FIG. 2B.

Then, by a heat treatment, the N-type impurity in the coating film 25 diffuses into a portion of the $N^-$-type silicon layer 21 in contact with the coating film 25 (portion facing the opening 24). By the diffusion of the N-type impurity, an N-type diffusion region 26 is formed in a top layer portion of the $N^-$-type silicon layer 21 as shown in FIG. 2C. After the N-type diffusion region 26 has been formed, the thermal oxide film 23 and the coating film 25 are removed from above the $N^-$-type silicon layer 21.

Figure 2D:
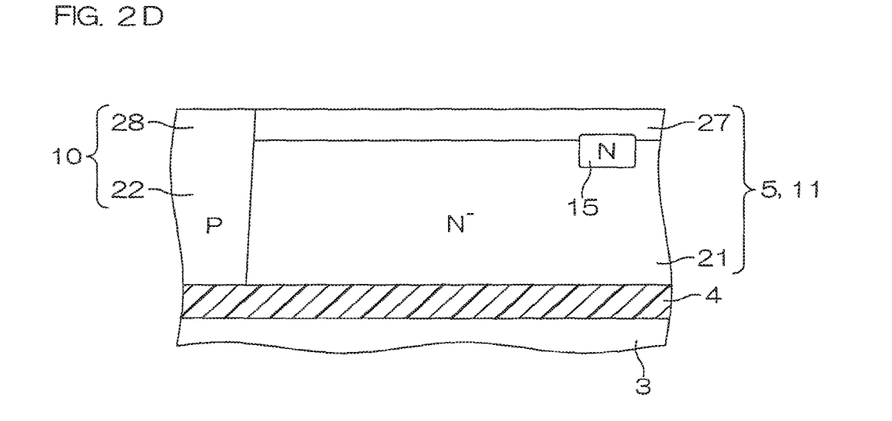
FIG. 2D is a schematic sectional view of a step subsequent to that of FIG. 2C.

Thereafter, as shown in FIG. 2D, an $N^-$-type epitaxial layer 27 having an N-type impurity concentration equal to the N-type impurity concentration of the $N^-$-type silicon layer 21 is formed on the $N^-$-type silicon layer 21 by an epitaxial growth method. The $N^-$-type epitaxial layer 27 is formed to a layer thickness of 5 μm. The SOI layer 5 of 30 μm layer thickness made of the $N^-$-type silicon layer 21 and the $N^-$-type epitaxial layer 27 is thereby obtained. A P-type region 28 is then formed by selectively implanting B or other P-type impurity in a portion of the $N^-$-type epitaxial layer 27 above the P-type region 22. The body region 10 made of the P-type regions 22 and 28 is thereby obtained and the drift region 11 made of the $N^-$-type silicon layer 21 and the $N^-$-type epitaxial layer 27 is obtained. The N-type region 15 is formed in the drift region 11 by diffusing the N-type impurity contained in the N-type diffusion region 26 into the $N^-$-type epitaxial layer 27.

Figure 2E:
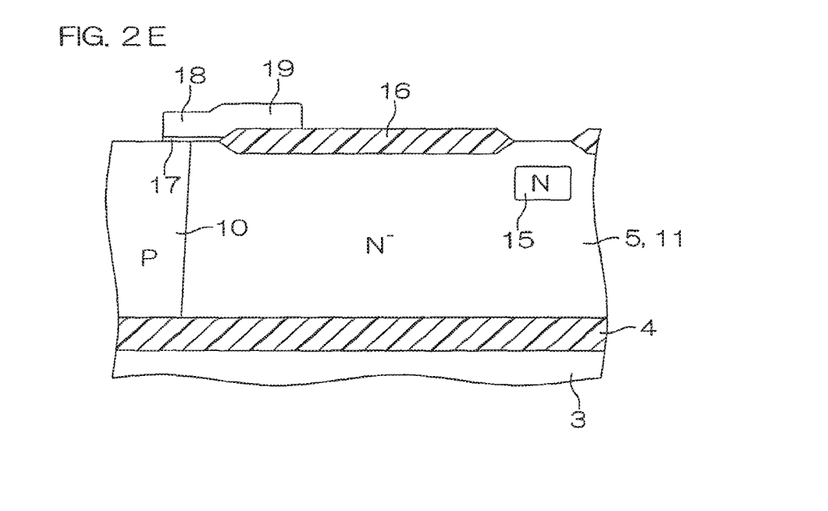
FIG. 2E is a schematic sectional view of a step subsequent to that of FIG. 2D.

Thereafter, by a LOCOS method, the LOCOS oxide film 16 is formed on the top surface of the drift region 11 as shown in FIG. 2E. Further, the gate oxide film 17 is formed across the top surface of the body region 10 and the top surface of the drift region 11 by a thermal oxidation method. Still further, a polysilicon deposition layer doped with a high concentration of the N-type impurity is formed on the SOI layer 5, the LOCOS oxide film 16, and the gate oxide film 17 by a P-CVD (Plasma Chemical Vapor Deposition) method. The polysilicon deposition layer is then patterned by the known photolithography technique and an etching technique. The gate electrode 18 is thereby formed on the gate oxide film 17 and the field plate 19 is formed on the LOCOS oxide film 16.

Thereafter, the source region 12 and the body contact region 13 are formed in the top layer portion of the body region 10 by the ion implantation method. Further, the drain region 14 is formed in a top layer portion of the drift region 11. When the interlayer insulating film 20, the source wiring 23, and the drain wiring 24 are formed, the semiconductor device 1 of the structure shown in FIG. 1 is obtained.

Figure 3:
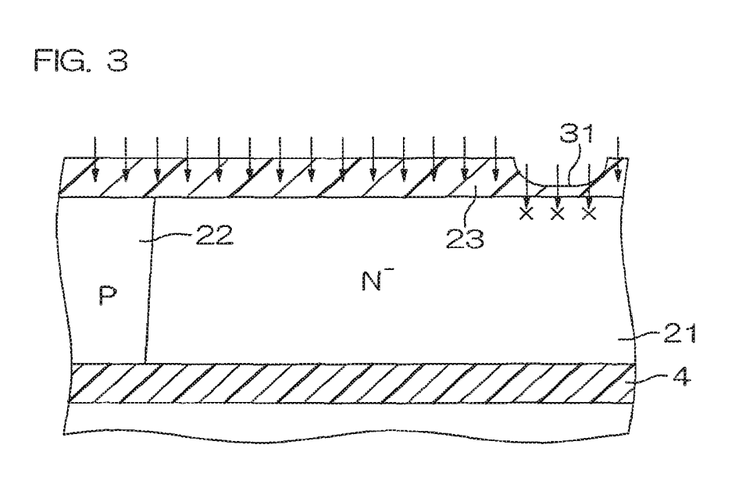
FIG. 3 is a schematic sectional view for describing another method for forming an N-type diffusion region (a method different from that of the step shown in FIG. 2B).

After the step shown in FIG. 2A, a step shown in FIG. 3 may be carried out in place of the step shown in FIG. 2B. In the step shown in FIG. 3, first, a thermal oxide film 23 made of $SiO_2$ is formed on the $N^-$-type silicon layer 21 by the thermal oxidation method. A recess 31 opposing the portion where the N-type diffusion region 26 is to be formed is then formed on a top surface of the thermal oxide film 23 by the known photolithography technique and etching technique. Thereafter, by the ion implantation method, As or P-type or other N-type impurity is implanted in a top layer portion of the $N^-$-type silicon layer 21 from the recess 31 of the thermal oxide film 23. Then, by performing a heat treatment (annealing treatment), the N-type diffusion region 26 is formed in the top layer portion of the $N^-$-type silicon layer 21 as shown in FIG. 2C. The thermal oxide film 23 is removed after the N-type diffusion region 26 has been formed.

Figure 4:
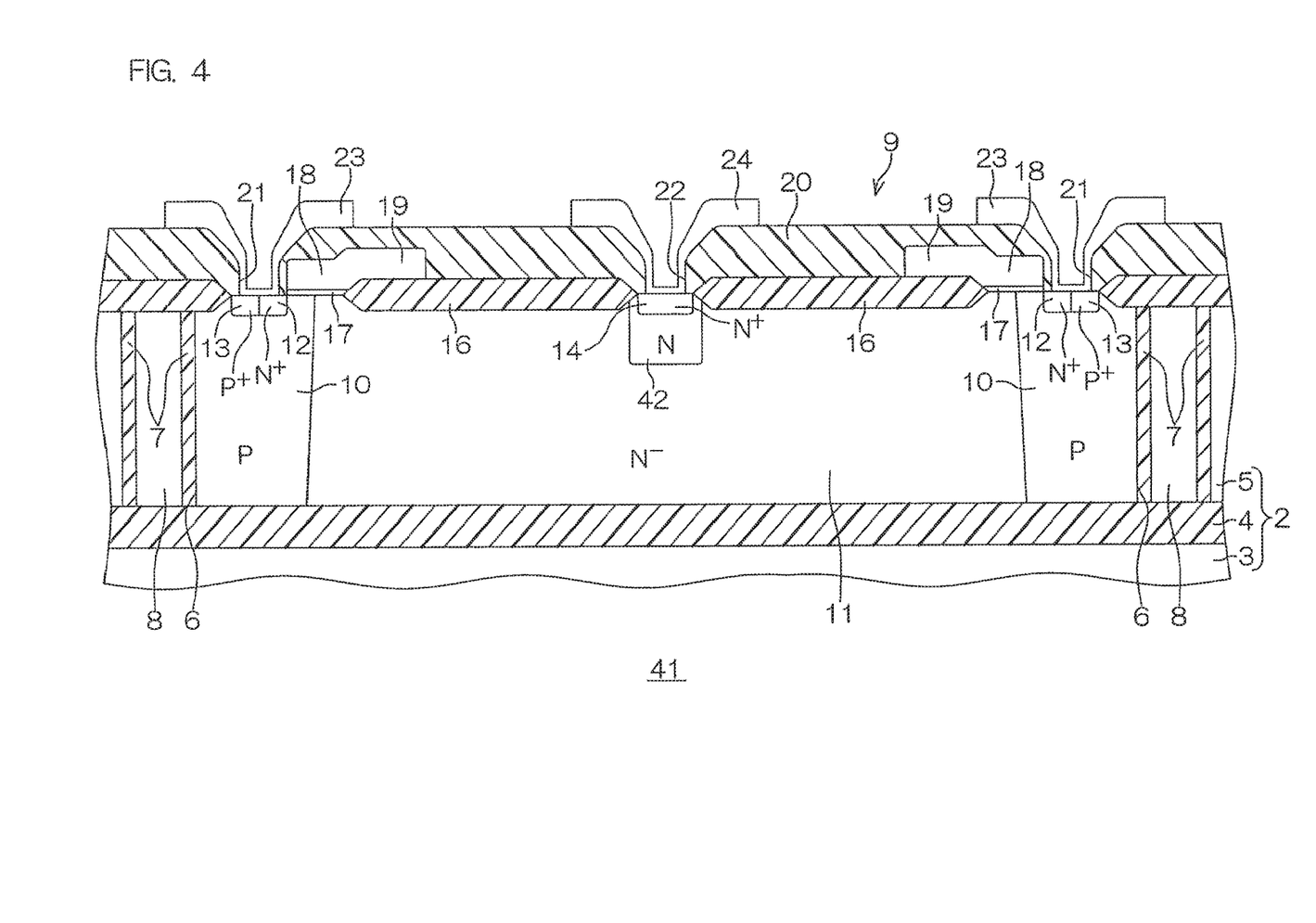
FIG. 4 is a schematic sectional view of a structure of a semiconductor device according to a second embodiment of the present invention.

FIG. 4 is a schematic sectional view of a structure of a semiconductor device according to a second embodiment of the present invention. In FIG. 4, portions equivalent to respective portions shown in FIG. 1 are provided with the same reference symbols as the respective portions. In regard to the structure shown in FIG. 4, differences with respect to the structure shown in FIG. 1 shall mainly be described below, and description of portions equivalent to the respective portions shown in FIG. 1 shall be omitted.

With the semiconductor device 1 shown in FIG. 1, the N-type region 15 is formed spaced apart from and at the BOX layer 4 side of the drain region 14. Meanwhile, with the semiconductor device 41 shown in FIG. 4, in the drift region 11, an N-type region 42 having an N-type impurity concentration higher than the N-type impurity concentration of the SOI layer 5 and lower than the N-type impurity concentration of the drain region 14 is formed adjacent to and at the BOX layer 4 side of the drain region 14. With the N-type region 42, for example, a maximum value of the N-type impurity concentration (peak concentration) is $10^{18}$/cm$^3$, and the peak concentration is located at a depth of 2 μm from the top surface of the drain region 14.

The same actions and effects as those of the structure shown in FIG. 1 can be exhibited by the structure shown in FIG. 4 as well. That is, for example, in a case where the layer thickness of the BOX layer 4 is 1.5 μm, the N-type impurity concentration of the drift region 11 is $3.5 \times 10^{14}$/cm$^3$, the peak concentration of the N-type region 15 is $10^{18}$/cm$^3$, and the peak concentration is located at a depth of 2 μm from the top surface of the drain region 14, a withstand voltage of no less than 600V can be obtained with the layer thickness of the SOI layer 5 being 30 μm.

FIGS. 5A to 5D are schematic sectional views for describing a method for manufacturing the semiconductor device shown in FIG. 4.

Figure 5A:
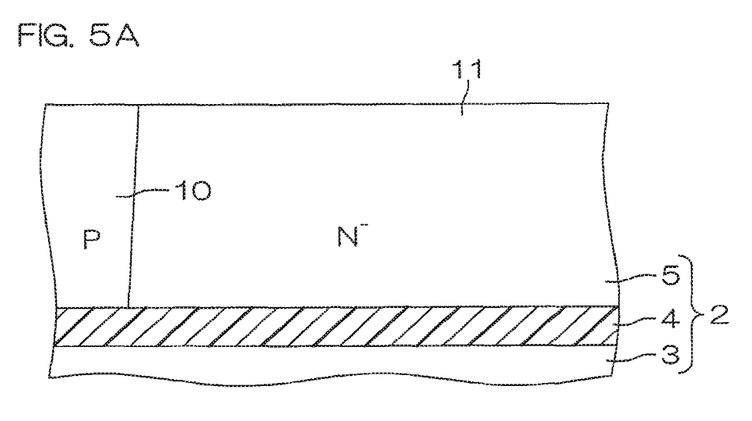
FIG. 5A is a schematic sectional view for describing a method for manufacturing the semiconductor device shown in FIG. 4.

For example, by implanting O (oxygen) in an N$^-$-type silicon substrate by the ion implantation method and thereafter thermally oxidizing the O, the thick film SOI substrate 2 having the BOX layer 4 of 1.5 μm layer thickness and the SOI layer 5 of 30 μm layer thickness is formed as shown in FIG. 5A. In this preparation process, the body region 10 and the drift region 11 are formed by selectively implanting B (boron) or other P-type impurity in the SOI layer 5.

Figure 5B:
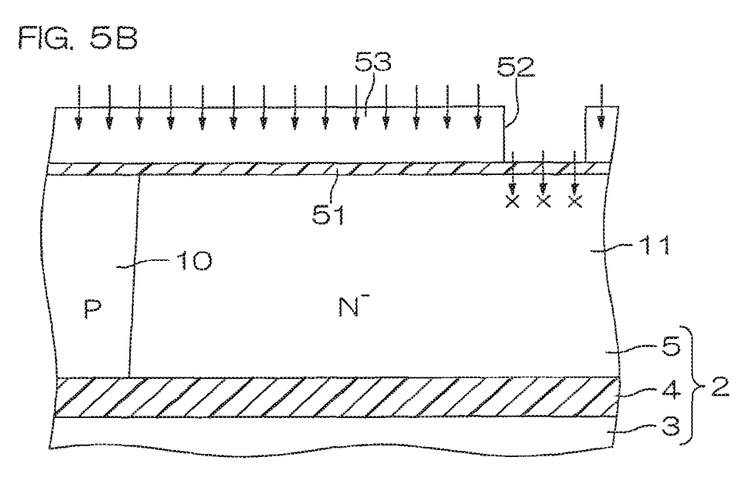
FIG. 5B is a schematic sectional view of a step subsequent to that of FIG. 5A.

Then, as shown in FIG. 5B, a thermal oxide film 51 made of SiO$_2$ is formed on the SOI layer 5 by the thermal oxidation method. A mask 53 having an opening 52 opposing to the portion where the N-type region 42 is to be formed is formed on the thermal oxide film 51 by the known photolithography technique and etching technique. Then, by the ion implantation method, As or P-type or other N-type impurity is implanted in a top layer portion of the drift region 11 via the opening 52 of the mask 53. After implantation of the N-type impurity, the mask 53 is removed.

Figure 5C:
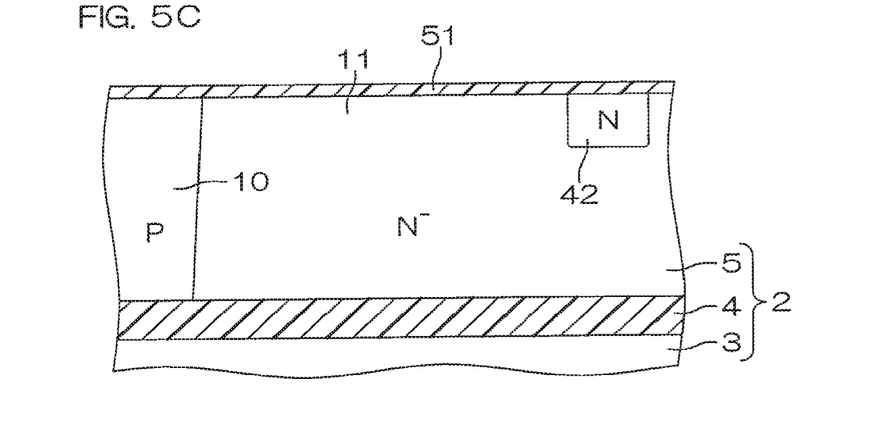
FIG. 5C is a schematic sectional view of a step subsequent to that of FIG. 5B.

Then, as shown in FIG. 5C, by the heat treatment (annealing treatment), the N-type impurity implanted in the drift region 11 is activated and the N-type region 42 is formed in the top layer portion of the drift region 11.

Figure 5D:
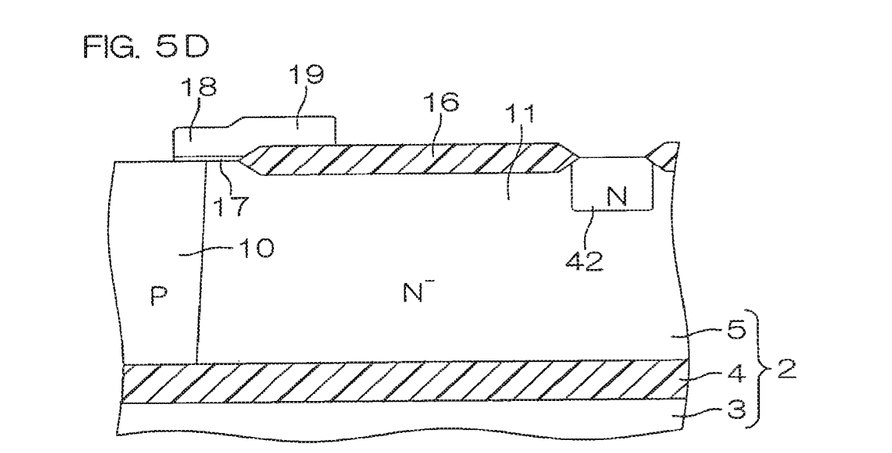
FIG. 5D is a schematic sectional view of a step subsequent to that of FIG. 5C.

After the N-type region 42 is formed, the thermal oxide film 51 is removed. Then, by the LOCOS method, the LOCOS oxide film 16 is formed on the top surface of the drift region 11 as shown in FIG. 5D. Further, the gate oxide film 17 is formed across the top surface of the body region 10 and the top surface of the drift region 11 by the thermal oxidation method. Still further, a polysilicon deposition layer doped with a high concentration of the N-type impurity is formed on the SOI layer 5, the LOCOS oxide film 16, and the gate oxide film 17 by the P-CVD method. The polysilicon deposition layer is then patterned by the known photolithography technique and an etching technique. The gate electrode 18 is thereby formed on the gate oxide film 17 and the field plate 19 is formed on the LOCOS oxide film 16.

Thereafter, the source region 12 and the body contact region 13 are formed in the top layer portion of the body region 10 by the ion implantation method. Further, the drain region 14 is formed in the top layer portion of the drift region 11 by the ion implantation method. When the interlayer insulating film 20, the source wiring 23, and the drain wiring 24 are formed, the semiconductor device 41 of the structure shown in FIG. 4 is obtained.

With the semiconductor devices 1 and 41, the formation position of the source region 12 and the body contact region 13 and the formation position of the drain region 14 may be reversed. That is, in the SOI layer 5, the P-type body region 10 may be formed in the central portion, the annular region along the side surface of the deep trench 6 (the region surrounding the body region 10) may be made the N$^-$-type drift region 11, the source region 12 and the body contact region 13 may be formed in the central portion in a plan view of the top layer portion of the body region 10, and the annular drain region 14 may be formed in the top layer portion of the drift region 11.

Furthermore, a configuration may be employed with which the conduction types of the respective semiconductor portions of the semiconductor devices 1 and 41 are inverted. That is, in the semiconductor devices 1 and 41, a P type portion may be replaced by an N type portion and an N type portion may be replaced by a P type portion.

While the present invention has been described in detail by way of the embodiments thereof, it should be understood that these embodiments are merely illustrative of the technical principles of the present invention but not limitative of the invention. The spirit and scope of the present invention are to be limited only by the appended claim.

What is claimed is:

1. A semiconductor device comprising:
   an insulating layer;
   a semiconductor layer of a first conductive type, laminated on the insulating layer;
   a deep trench having a thickness reaching the insulating layer from a top surface of the semiconductor layer, the deep trench defining an edge of an element forming region therein;
   a body region of a second conductive type formed across an entire thickness of the semiconductor layer so as to have a thickness reaching the insulating layer from a top surface of the semiconductor layer along a side surface of the deep trench in the element forming region;
   a drain region of the first conductive type formed at an almost center of the element forming region, the drain region formed in the top surface of the semiconductor layer;
   a drift region of the first conductive type formed between the body region and the drain region in the element forming region;
   a source region of the first conductive type formed in a top layer portion of the body region;
   an insulative film formed on the drift region, the insulative film having an opening in which the drain region is exposed; and
   a first conductive type region formed in the drift region, said first conductive type region expanding under the drain region and having a deepest portion reaching a position deeper than the drain region, and having a first conductive type impurity concentration higher than the first conductive type impurity concentration of the semiconductor layer and lower than the first conductive type impurity concentration of the drain region, wherein the semiconductor layer has a thickness of less than 40 µm, the first conductive type region is spaced apart from the drain region, the first conductive type region has a first thickness $T_1$ in a thickness direction of the semiconductor layer, the drain region has a second thickness $T_2$ in the thickness direction of the semiconductor layer, a part of the drift region is sandwiched between the first conductive type region and the drain region, the part of the drift region sandwiched between the first conductive type region and the drain region has a third thickness $T_3$ in the thickness direction of the semiconductor layer, and the first thickness $T_1$, the second thickness $T_2$ and the third thickness $T_3$ satisfy relational expressions of $T_1 > T_2 > T_3$.

2. The semiconductor device according to claim 1, wherein the insulative film includes a middle portion having a constant thickness and an edge portion located between the middle portion and the opening.

3. The semiconductor device according to claim 1, wherein a peak concentration of the first conductive type impurity concentration in the first conductive type region is $10^{18\sim19}/cm^3$.

4. The semiconductor device according to claim 3, wherein the first conductive type region has the peak concentration at a position of 2 to 5 µm depth from the top surface of the drain region.

5. The semiconductor device according to claim 1, wherein the first conductive type region has the peak concentration at a position of 0 to 10 µm depth from the top surface of the drain region.

6. The semiconductor device according to claim 1, wherein the first conductive type region is formed wider than the drain region.

7. The semiconductor device according to claim 6, wherein the insulative film includes a middle portion having a constant thickness and an edge portion located between the middle portion and the opening, and the edge portion of the opening of the insulative film and an outer edge portion of the first conductive type region are overlapped in a plan view.

8. The semiconductor device according to claim 1, wherein the insulating layer comprises a BOX layer made of $SiO_2$.

9. The semiconductor device according to claim 2, wherein the insulative film is a LOCOS oxide film;

a gate oxide film is formed on the semiconductor layer adjacent to the source region;

a gate electrode is formed on the gate oxide film; and a field plate is formed integrally to the gate electrode on the gate oxide film and the LOCOS oxide film.

10. The semiconductor device according to claim 1, wherein a ground voltage is applied to the source region while a high positive voltage is applied to the drain region.

11. The semiconductor device according to claim 1, wherein a body contact region of the second conductive type is formed adjacent to the source region.

12. The semiconductor device according to claim 1, wherein inner side surfaces of the deep trench are covered with a silicon oxide film and an interior of the deep trench is completely filled with a polysilicon via the silicon oxide film, and a LOCOS oxide film is formed on the deep trench.

13. The semiconductor device according to claim 1, wherein the insulating layer has a thickness less than 4 µm.

* * * * *